United States Patent

Violette et al.

[11] Patent Number: 5,846,873
[45] Date of Patent: Dec. 8, 1998

[54] METHOD OF CREATING ULTRA-SMALL NIBBLE STRUCTURES DURING MOSFET FABRICATION

[75] Inventors: Michael P. Violette; Fernando Gonzalez, both of Boise, Id.

[73] Assignee: Micron Technology, Inc., Boise, Id.

[21] Appl. No.: 597,586

[22] Filed: Feb. 2, 1996

[51] Int. Cl.$^6$ ............................................ H01L 21/3205
[52] U.S. Cl. .................. 438/585; 438/586; 438/592; 438/639; 438/668; 438/671; 438/637
[58] Field of Search .................... 438/666, 673, 438/258, 696, 585, 586, 587, 588, 592, 595, 596, 639, 668, 671, 637

[56] References Cited

U.S. PATENT DOCUMENTS

| | | | |
|---|---|---|---|
| 4,810,666 | 3/1989 | Taji | 438/696 |
| 5,401,682 | 3/1995 | Yang | 438/666 |
| 5,439,846 | 8/1995 | Nguyen et al. | 438/595 |
| 5,472,892 | 12/1995 | Gwen et al. | 438/258 |
| 5,523,258 | 6/1996 | Petti et al. | 438/585 |
| 5,525,552 | 6/1996 | Huang | 438/666 |
| 5,550,079 | 8/1996 | Lin | 438/587 |
| 5,563,096 | 10/1996 | Nasr | 438/586 |
| 5,612,240 | 3/1997 | Chang | 438/586 |
| 5,627,093 | 5/1997 | Hachisuka et al. | 438/666 |
| 5,656,527 | 8/1997 | Choi et al. | 438/258 |
| 5,658,812 | 8/1997 | Araki | 438/258 |
| 5,658,813 | 8/1997 | Ehomoto | 438/258 |
| 5,670,424 | 9/1997 | Chan et al. | 438/586 |

*Primary Examiner*—Olik Chaudhuri
*Assistant Examiner*—Lynne A. Gurley
*Attorney, Agent, or Firm*—Thorp, Reed & Armstrong

[57] ABSTRACT

A method of creating ultra-small nibble structures using a modification of an already existing mask includes the steps of depositing a layer of nitride on a circuit being fabricated according to standard MOSFET process steps. A layer of photoresist is patterned using a modification of an existing mask, such as a contact mask modified to include a nibble pattern. The nitride layer and an underlying oxide layer are removed according to the patterned photoresist to create a contact opening and an opening over the field oxide. Spacers may be created in the opening over the field oxide. A conductive layer and a polysilicon layer exposed in the opening over the field oxide are removed extending the opening down to the field oxide to create a nibble structure in the polysilicon layer.

22 Claims, 4 Drawing Sheets

METHOD OF CREATING ULTRA-SMALL NIBBLE STRUCTURES DURING MOSFET FABRICATION

BACKGROUND OF THE INVENTION

1. Field of the Invention

The present invention is directed generally to processes used in the manufacture of solid state electronic devices and, more particularly, to processes used in the manufacture of memory devices employing metal oxide semiconductor field effect transistors (MOSFETs).

2. Description of the Background

The fabrication of MOSFETs is itself a complex process. The fabrication of devices which employ MOSFETs is equally complex, if not more so. For example, fabrication of MOSFETs requires an understanding of crystal structures and the methodologies for adding and selectively removing material from a crystalline wafer. Material may be added by oxidation, diffusion, ion implantation, and chemical deposition to name a few techniques. Removal of material may be accomplished, for example, by ion etching, chemical etching, and plasma etching.

Putting all those various steps together to build a device which has hundreds of thousands of MOSFETs interconnected to form a complex device such as a Static Random Access Memory (SRAM) is a complicated matter. When designing a circuit, other considerations come into play such as heat dissipation, line capacitance, speed, etc. Also of primary importance is the particular technology chosen and its inherent limitations. For example, using photolithography places a lower limit of about 0.25 microns on the size of components or component parts.

The drive for ever more complicated devices has driven the size of individual components to the smallest size compatible with the technology used to produce the device. In some circumstances, planar space on chips has become so scarce that devices like capacitors are formed in trenches or stacked on top of other devices to save space. In any event, such small, closely packed devices must nevertheless each carry out the function for which they are fabricated in a manner that does not interfere with neighboring devices. To permit that, sometimes components, component parts, or spacing between components are made larger than the smallest dimension permitted by the fabrication technology to insure proper operation.

Other considerations in the fabrication of complicated devices such as SRAMs are the number of masks needed to fabricate the device and the number of process steps required. It may be that a desirable geometry simply requires too many additional process steps or the creation of one or more additional masks such that the advantage gained by the desirable geometry is more than offset by the inefficiencies encountered in its production. It thus becomes a very difficult engineering problem to design desirable geometries that satisfy all the requirements demanded of the finished device and which can be produced economically by commercially available processes.

One example of this type of engineering problem can be seen in the design and fabrication of nibble structures. A nibble structure is that portion of a poly gate which extends past the active area and over a portion of the field oxide. It is desirable to have the poly gate extend past the active area to ensure good overlap onto the active area, but not too far over the field oxide so as not to interfere with a neighboring poly gate. Current practice dictates making the nibble structure larger than a minimum size to insure that rounding off that occurs during the creation of openings in the poly layer does not make the nibble structure too small. Also, typical commercially available photolithography techniques require that the openings between poly gates be a minimum of 0.25 microns. It is thus necessary to increase the spacing between devices to insure that when the opening is made, and rounding off occurs, the resulting nibble structure is not too small. It would be advantageous to create nibble structures and poly gate spacings that are as small as possible, and to do so without requiring the use of additional masks and associated process steps.

SUMMARY OF THE INVENTION

The present invention is directed to creating ultra-small nibble structures using a modification of an already existing mask. The method is comprised of the steps of depositing a layer of nitride on a circuit being fabricated according to standard MOSFET process steps. A layer of photoresist is patterned using a modification of an existing mask such as a contact mask modified to include a nibble pattern. The nitride layer and an underlying oxide layer are removed according to the patterned photoresist to create a contact opening and an opening over the field oxide. Spacers may be created in the opening over the field oxide. A conductive layer and a polysilicon layer exposed in the opening over the field oxide are removed extending the opening down to the field oxide to create a nibble structure in the polysilicon layer.

Use of the spacer in the opening over the field oxide permits the poly to poly spacing above the field oxide to be approximately 0.15 microns. Use of the spacers also eliminates rounding of the poly gate. That allows the nibble structure to be designed ultra-small because the process will not result in the structure being fabricated smaller than designed. The opening over the field oxide is created using a modification of an existing mask, for example a contact mask, so that no additional mask step is required. That allows a desirable geometry to be fabricated without uneconomical modifications of existing fabrication processes. Those advantages and benefits of the present invention, and others, will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

Figure 1:
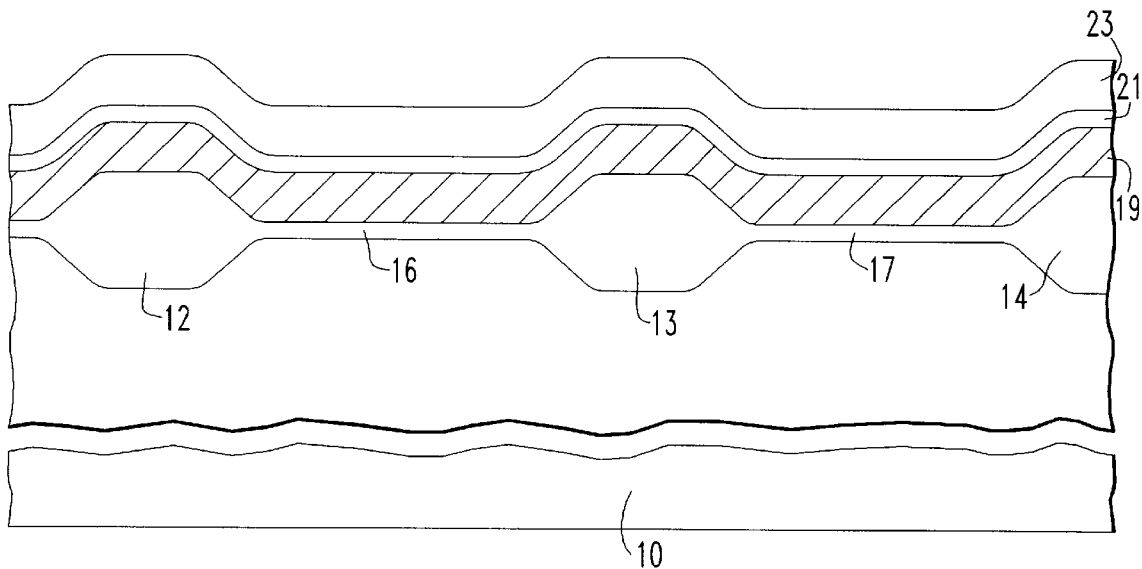
FIG. 1 illustrates a portion of a wafer on which a local oxidation of silicon process (LOCOS) has been performed, followed by deposition of layers of polysilicon, metal, and nitride.

FIG. 1 illustrates a portion of a wafer 10 on which a local oxidation of silicon (LOCOS) process has been performed. The LOCOS process is well known in the art and is not described in detail herein. The LOCOS process results in field oxide regions 12, 13, 14. Between the field oxide regions 12 and 13 is a region of gate oxide 16. Between the field oxide regions 13 and 14 is a region of gate oxide 17. As is known in the art, the gate oxide regions 16 and 17 may be formed as part of the LOCOS process or, after the LOCOS process, the gate, oxide regions may be stripped and thermally regrown for the process of providing at more pure gate oxide. The particular process used on the wafer 10 to form field oxide regions 12, 13, 14 and gate oxide regions 16, 17 is not of particular importance with respect to the method of the present invention.

A polysilicon layer 19 is deposited over the gate oxide regions 16, 17 and field oxide regions 12, 13, 14. A first conductive layer 21, for example a layer of Wsix, is deposited over the polysilicon layer 19. A first layer of oxide 23 is deposited over the first conductive layer 21. The layers 19, 21, and 23 may have the following exemplary thicknesses: 2,000 angstroms, 1,200 angstroms, and 4,000 angstroms, respectively.

A layer of photoresist (not shown) is applied on top of the first layer of oxide 23. The layer of photoresist is patterned using a poly gate pattern. Thereafter, an etch is performed which selectively removes portions of the first layer of oxide 23, first layer of conductive material 21, and polysilicon layer 19 to achieve the configuration illustrated in FIG. 2.

Figure 2:
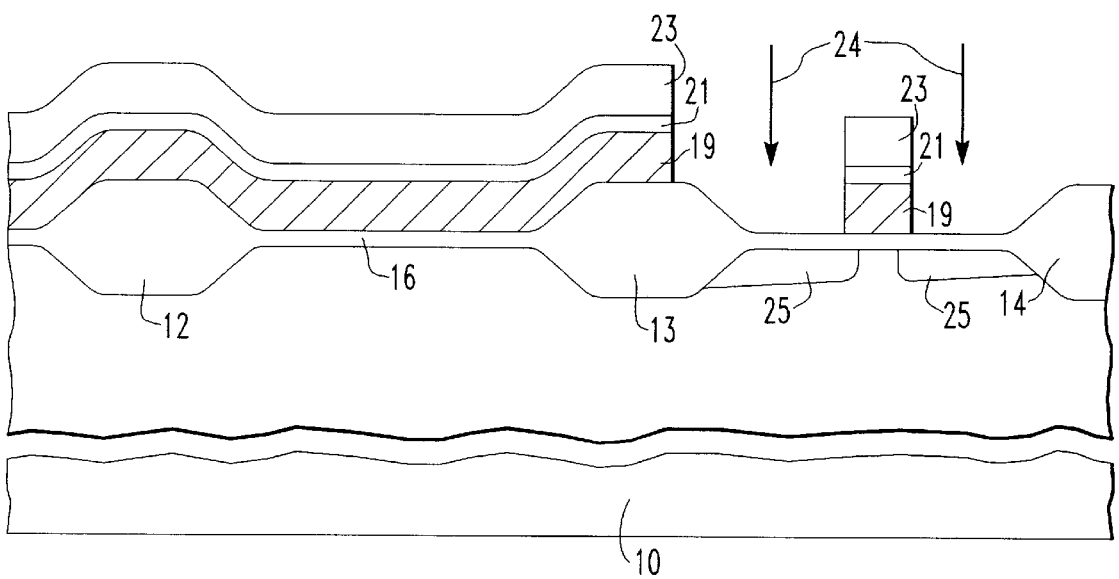
FIG. 2 illustrates the portion of the wafer of FIG. 1 after poly gate patterning and etching.

With the wafer configured as shown in FIG. 2, it is now possible to perform an implant in the active area as shown by arrows 24. The material and energy level used for the implant depends upon the desired characteristics of the completed device and does not form a feature of the present invention. For example, phosphorus or arsenic implants may be performed to create areas 25 which have an excess of electrons.

Figure 3:
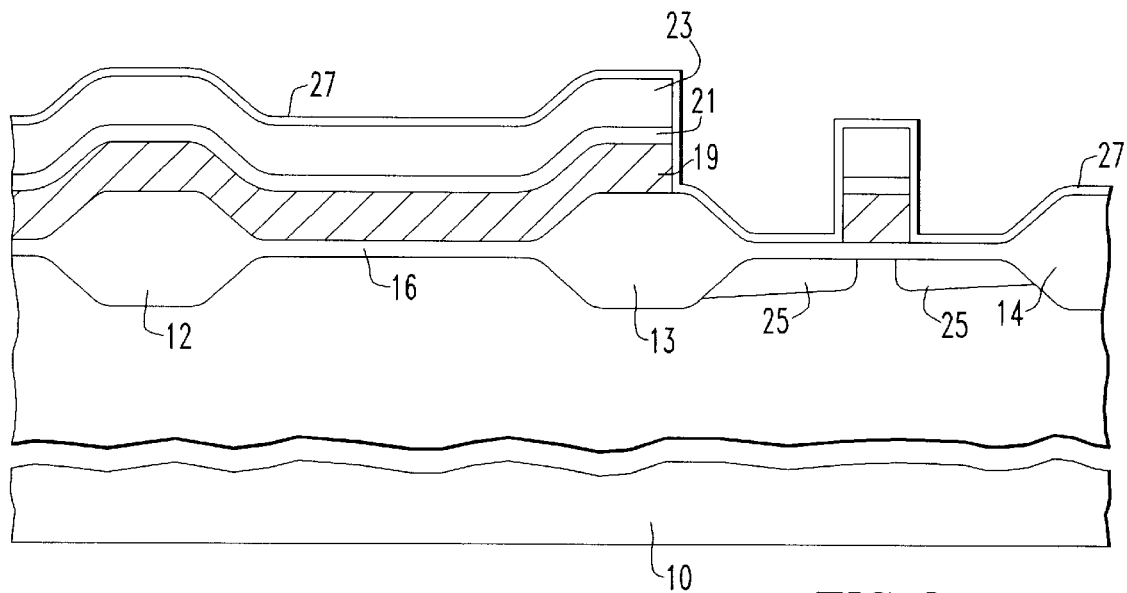
FIG. 3 illustrates the portion of the wafer of FIG. 2 after the deposition of a thin nitride layer.

Turning to FIG. 3, after the removal of any remaining photoresist, a layer of nitride 27 is deposited on the wafer. The nitride is preferably a thin layer approximately 200 angstroms thick. The nitride layer 27 is covered by a layer of photoresist (not shown) which is patterned using an existing mask which has been modified to include the nibble pattern. In the exemplary process being discussed, the existing mask is an exhume contact mask that has been modified to include the nibble pattern. Depending on the process, some other mask may be a more appropriate choice to modify to include the nibble pattern. Thereafter, the wafer is subjected to a nitride/oxide etch which selectively removes portions of nitride layer 27 and oxide layer 23 as shown in FIG. 4.

Figure 4:
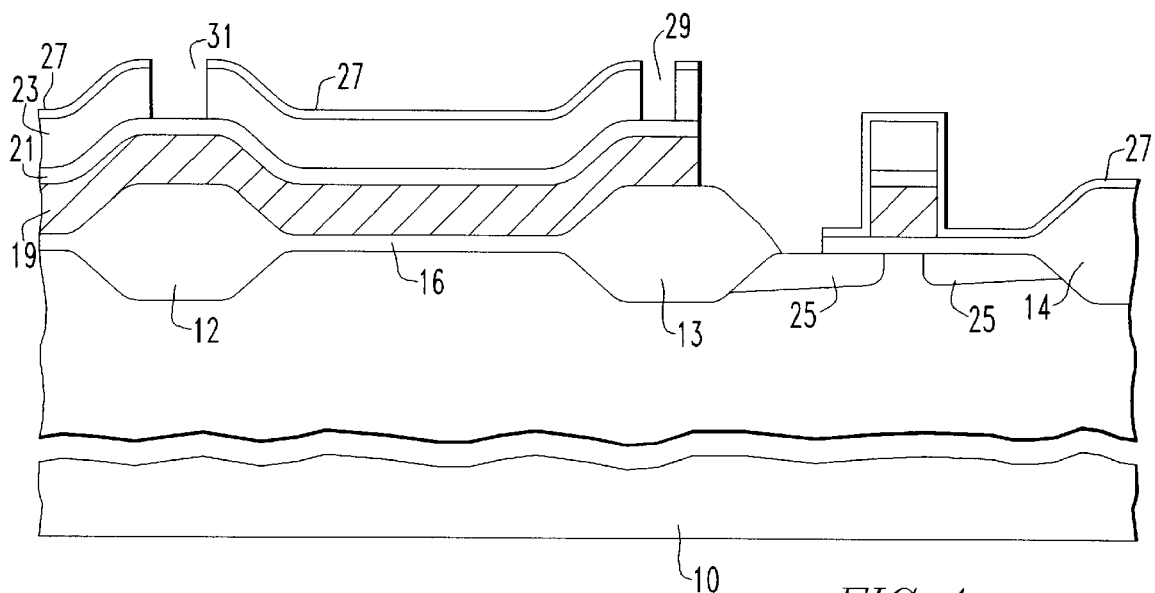
FIG. 4 illustrates the portion of the wafer of FIG. 3 after exhume contact/nibble patterning and a nitride/oxide etching.

In FIG. 4, it is seen that an opening 29 for the exhume contact is formed and an opening 31 over field oxide 12 is formed. The opening 31 will be used to define the length of the nibble structure which will be formed by that portion of the polysilicon layer 19 which extends over the edge of the field oxide region 12. After the openings 29 and 31 have been created, the remainder of the photoresist is removed.

Figure 5:
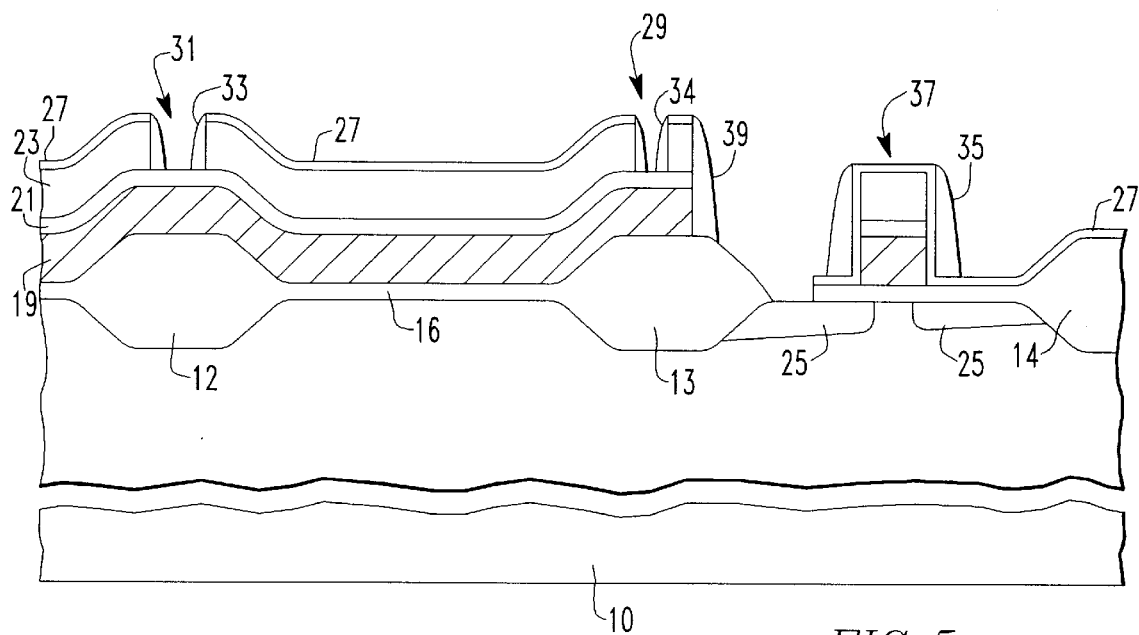
FIG. 5 illustrates the portion of the wafer of FIG. 4 after an oxide layer has been etched to leave oxide spacers.

Turning to FIG. 5, a second layer of oxide (not shown), such as a teos oxide, is deposited. The oxide layer may be on the order of 1,000 angstroms thick. The teos oxide is then etched with an etch that stops on nitride. The result of that etch is to create spacers 33 in opening 31. Spacers 34 are also formed in opening 29. A spacer 35 is formed on that portion of the polysilicon layer 19, conductive layer 21, and oxide layer 23 which collectively form a gate terminal 37 of a transistor. A spacer 39 is also formed on top of field oxide region 13 adjacent the exposed edge of the polysilicon layer 19, conductive layer 21, and first layer of oxide 23.

Figure 6:
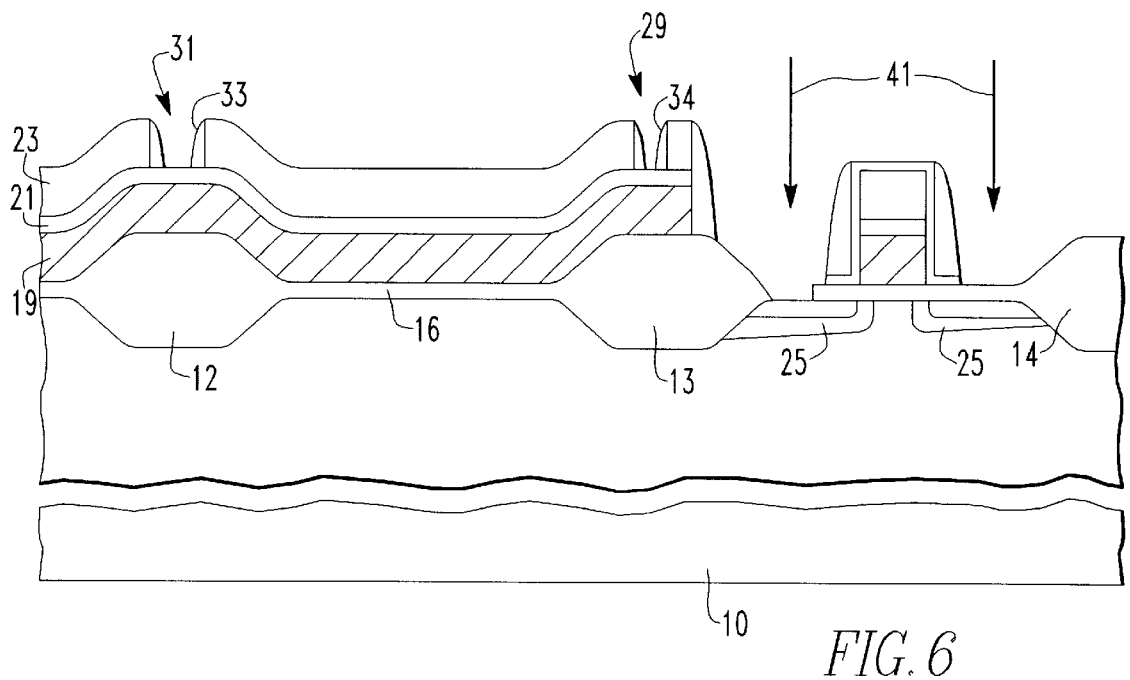
FIG. 6 illustrates the portion of the wafer of FIG. 5 with the remainder of the exposed nitride removed.

Turning to FIG. 6, a wet nitride etch is performed which removes all of the remaining exposed nitride layer 27. Thereafter, an implant may be performed in the active area as represented by the arrows 41. The particular implant that is performed is not relevant to the method of the present invention and is therefore not further described.

Figure 7:
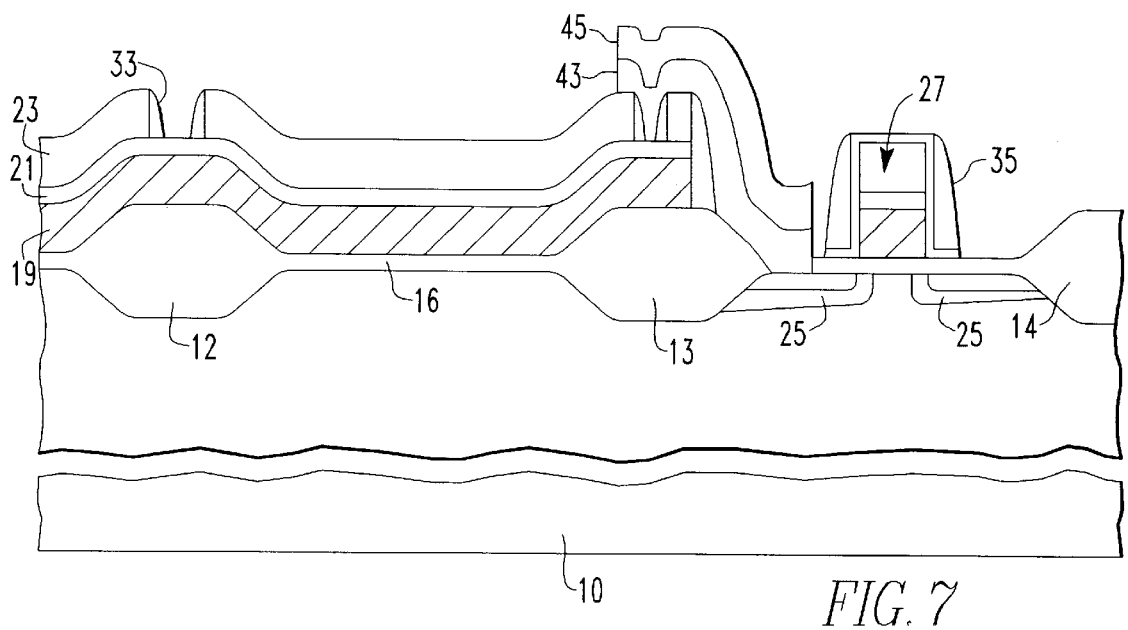
FIG. 7 illustrates the portion of the wafer of FIG. 6 after the deposition of a metal layer and an oxide layer which are both etched according to a metal pattern.

In FIG. 7, the substrate is subjected to a process which deposits a second layer of conductive material 43, for example titanium or doped polysilicon. A third layer of oxide 45 is deposited on the layer of conductive material 43. Thereafter, photoresist is applied and patterned according to a conductive metal pattern, such as a titanium pattern. Thereafter, a dry oxide/titanium/poly etch is performed which removes portions of the conductive layer 43, oxide layer 45 (leaving behind selected portions as shown in FIG. 7), and etches the conductive layer 21 and polysilicon layer 19 exposed in opening 29.

Figure 8:
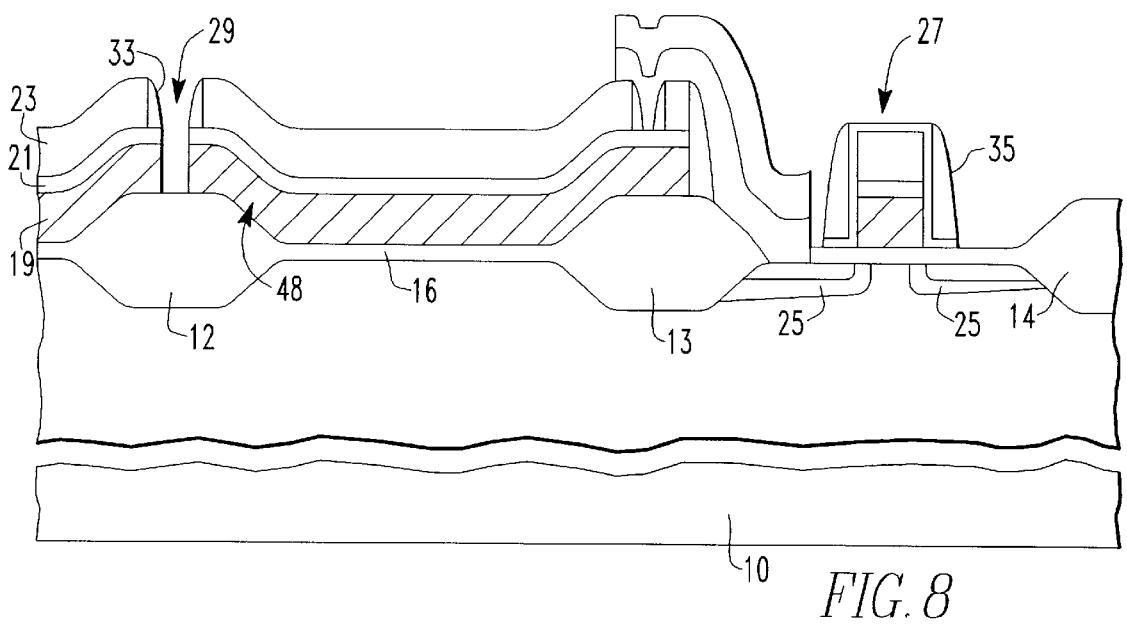
FIG. 8 illustrates the portion of the wafer of FIG. 6 with the opening over the field oxide etched down to the field oxide to create a nibble structure.

The opening 29 is approximately 0.25 microns in width before the spacer 33 is created. After the spacer 33 is created, the width of the opening tapers from the top of the first layer of oxide 23 to the bottom of the first layer of oxide 23 as shown in FIG. 8. At the bottom of the first layer of oxide 23, the opening 29 is approximately 0.15 microns wide. Thereafter, as a result of the etch, the width of the opening remains substantially constant at 0.15 microns through the first conductive layer 21 and the layer of polysilicon 19. When the etch cuts through the poly layer 19, a nibble structure 48 is formed. In the prior art, nibble structures are on the order of 0.2 to 0.25 microns. Using the method of the present invention, ultra-small nibble structures on the order of 0.1 to 0.15 microns can be fabricated.

After the nibble structure 48 is formed, the remaining photoresist is removed, and the wafer is subjected to standard processing steps, which are not shown.

Figure 9:
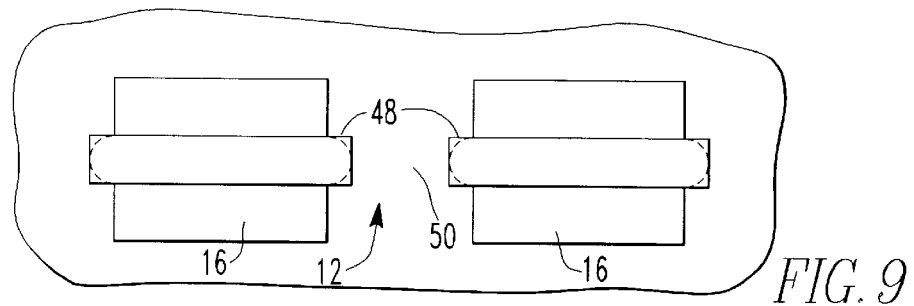
FIG. 9 is a top view of two adjacent gate oxide regions and the polygates for each.

The present invention represents several advances over the prior art as illustrated in FIG. 9 which is a top view looking down onto two gate oxide regions 16 separated by a field oxide region 12. First, the nibble structure 48 formed by that portion of the poly layer 19 which extends beyond gate oxide region 16 to overlap field oxide region 12 can be precisely controlled. It is not necessary to make the nibble structure longer than needed for fear that rounding as a result of the photolithographic process, shown in FIG. 9 by dashed lines, will excessively shorten the nibble structure. The use of the spacer 33 insures that rounding does not occur and that the cut 50 of the polysilicon layer 19 occurs where desired thereby insuring the proper size of the nibble structure 48.

Additionally, the cut 50 in the polysilicon layer 19 is only 0.15 microns wide thereby allowing devices (active areas 16) to be laid out somewhat closer together. That, combined with the shortening of the length of the nibble structure, represents a substantial savings in surface area thereby allowing for greater component densities. Furthermore, the aforementioned advantageous geometry is achieved by modifying an exhume contact pattern to create the opening 29 over the field oxide region 12 at the same time that the exhume contact opening is formed. Therefore, no additional mask step is required.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A method of creating a nibble structure using an existing mask, comprising the steps of:

depositing a layer of nitride;

patterning a layer of photoresist with an existing mask modified to include a nibble pattern;

removing a portion of the nitride layer and an underlying oxide layer according to the patterned photoresist to create an opening over the field oxide;

creating spacers in the opening over the field oxide leaving an exposed portion of the nitride layer; removing the exposed portion of the nitride layer; and removing a conductive layer and a polysilicon layer exposed in the opening over the field oxide down to the field oxide to create a nibble structure in the polysilicon layer.

2. The method of claim 1 wherein said step of removing the nitride layer and an underlying oxide layer to create an opening over the field oxide includes the step of creating an opening over the field oxide that is approximately 0.25 microns wide.

3. The method of claim 1 wherein said step of removing a conductive layer and a polysilicon layer exposed in the opening over the field oxide includes the step of etching a layer of tungsten and etching a layer of polysilicon exposed in the opening over the field oxide.

4. The method of claim 3 wherein said step of etching a tungsten layer and a polysilicon layer includes the step of etching with an etch that is selective to oxide.

5. The method of claim 1 wherein said step of removing a conductive layer and a polysilicon layer exposed in the opening results in the opening having a width of less than approximately 0.25 microns at the polysilicon layer.

6. The method of claim 5 wherein said step of removing a conductive layer and a polysilicon layer exposed in the opening results in the opening having a width of approximately 0.15 microns at the polysilicon layer.

7. The method of claim 1 wherein said step of depositing a layer of nitride includes the step of depositing a layer of nitride approximately 200 angstroms thick.

8. The method of claim 1 wherein said step of creating spacers includes the steps of depositing an oxide layer on the nitride layer and etching the oxide layer with an etching process that stops at the nitride layer.

9. The method of claim 8 wherein said step of depositing an oxide layer includes the step of depositing an oxide layer approximately 1000 angstroms thick.

10. The method of claim 1 wherein said step of creating spacers includes the step of creating spacers of TEOS oxide.

11. A method of creating a nibble structure using an exhume contact mask, comprising the steps of:

performing a local oxidation of silicon process on a substrate;

creating gate oxide regions between field oxide regions;

depositing a layer of polysilicon over the gate oxide and field oxide regions;

depositing a first layer of conductive material over said layer of polysilicon;

depositing a first layer of oxide over said layer of conductive material;

patterning a layer of photoresist and etching the first oxide, conductive material, and polysilicon layers;

conducting an implant in an active area of the substrate;

depositing a layer of nitride;

patterning a layer of photoresist and etching the nitride and first oxide layers to create an exhume contact opening and an opening over the field oxide;

depositing a second layer of oxide;

removing the second layer of oxide so as to leave spacers in the opening over the field oxide and in the exhume contact opening and to leave a remaining exposed nitride;

removing the remaining exposed nitride;

performing an implant;

depositing a second layer of conductive material;

depositing a third layer of oxide;

patterning a layer of photoresist and etching the third layer of oxide and the second layer of conductive material; and. patterning a layer of photoresist and etching in the opening over the field oxide through the first layer of conductive material and the layer of polysilicon down to the field oxide region to create a nibble structure in the polysilicon layer.

12. The method of claim 11 wherein said step of etching the nitride and first oxide layers to create an exhume contact opening and an opening over the field oxide includes the step of creating an opening over the field oxide that is approximately 0.25 microns wide.

13. The method of claim 11 wherein said step of etching in the opening over the field oxide includes the step of etching a layer of tungsten and etching a layer of polysilicon exposed in the opening over the field oxide.

14. The method of claim 13 wherein said step of etching a layer of tungsten and a layer of polysilicon includes the step of etching with an etch that is selective to oxide.

15. The method of claim 1 wherein said step of etching in the opening over the field oxide results in the opening having a width of less than approximately 0.25 microns at the polysilicon layer.

16. The method of claim 15 wherein said step of etching in the opening over the field oxide results in the opening having a width of approximately 0.15 microns at the polysilicon layer.

17. The method of claim 11 wherein said step of depositing a layer of nitride includes the step of depositing a layer of nitride approximately 200 angstroms thick.

18. The method of claim 11 wherein said step of removing the second layer of oxide includes the step of etching the second layer of oxide with an etching process that stops at the nitride layer.

19. The method of claim 11 wherein said step of depositing a second layer of oxide includes the step of depositing a layer of teos oxide.

20. The method of claim 19 wherein said step of depositing a layer of teos oxide includes the step of depositing a layer of teos oxide approximately 1000 angstroms thick.

21. A method of creating a nibble structure using an exhume contact mask, comprising the steps of:

depositing a layer of nitride;

patterning a layer of photoresist with an exhume contact mask modified to include a nibble pattern;

removing a portion of the nitride layer and an underlying oxide layer according to the patterned photoresist to create an exhume contact opening and an opening over the field oxide;

creating spacers in the opening over the field oxide leaving an exposed portion of the nitride layer; removing the exposed portion of the nitride layer; and removing a conductive layer and a polysilicon layer exposed in the opening over the field oxide down to the field oxide to create a nibble structure in the polysilicon layer.

22. The method of claim 21 wherein said step of creating spacers includes the step of creating spacers in the exhume contact opening.

* * * * *